(12) United States Patent
Minegishi et al.

(10) Patent No.: US 8,765,831 B2
(45) Date of Patent: Jul. 1, 2014

(54) PHOTOCURABLE RESIN COMPOSITION

(75) Inventors: Shoji Minegishi, Saitama-ken (JP); Masao Arima, Saitama-ken (JP)

(73) Assignee: Taiyo Holdings Co., Ltd., Tokyo (JP)

( * ) Notice: Subject to any disclaimer, the term of this patent is extended or adjusted under 35 U.S.C. 154(b) by 157 days.

(21) Appl. No.: 13/384,716

(22) PCT Filed: Jul. 21, 2010

(86) PCT No.: PCT/JP2010/004673
§ 371 (c)(1),
(2), (4) Date: Jan. 18, 2012

(87) PCT Pub. No.: WO2011/010459
PCT Pub. Date: Jan. 27, 2011

(65) Prior Publication Data
US 2012/0125672 A1    May 24, 2012

(30) Foreign Application Priority Data

Jul. 21, 2009  (JP) ................................ 2009-170304

(51) Int. Cl.
*C08F 2/46*   (2006.01)
*C08G 61/04*  (2006.01)

(52) U.S. Cl.
USPC .................................................. 522/1; 520/1

(58) Field of Classification Search
USPC .................................................. 522/1; 520/1
See application file for complete search history.

(56) References Cited

U.S. PATENT DOCUMENTS

| | | | |
|---|---|---|---|
| 6,569,603 B2 | 5/2003 | Furukawa | |
| 7,718,714 B2 | 5/2010 | Minegishi | |
| 2010/0243304 A1 | 9/2010 | Otsuki et al. | |

FOREIGN PATENT DOCUMENTS

| | | | |
|---|---|---|---|
| JP | 7-33837 A | | 2/1995 |
| JP | 2000 109541 | | 4/2000 |
| JP | 2004 138752 | | 5/2004 |
| JP | 2005 62451 | | 3/2005 |
| JP | 3654422 | | 3/2005 |
| JP | 2006-285177 | * | 10/2006 |
| JP | 2006 285177 | | 10/2006 |
| JP | 2007-164126 | * | 6/2007 |
| JP | 2007-164126 A | | 6/2007 |
| JP | 2007-224169 | | 9/2007 |
| JP | 2008 299294 | | 12/2008 |
| JP | 2011-27770 | | 2/2011 |
| JP | 2011-42711 | | 3/2011 |
| JP | 2011-43565 | | 3/2011 |
| JP | 2011-75923 | | 4/2011 |
| JP | 2011-164304 | | 8/2011 |

OTHER PUBLICATIONS

U.S. Appl. No. 13/517,648, filed Jun. 14, 2012, Ito, et al.
Korean Office Action issued Jul. 12, 2013 in Patent Application No. 10-2012-7001503.
English translation of the International Preliminary Report on Patentability issued Feb. 16, 2012 in PCT/JP2010/004673.
English translation of the Written Opinion of the International Searching Authority issued Oct. 19, 2010 in PCT/JP2010/004673.
International Search Report Issued Oct. 19, 2010 in PCT/JP10/04673 Filed Jul. 21, 2010.

* cited by examiner

*Primary Examiner* — Ling Choi
*Assistant Examiner* — Jessica E Whiteley
(74) *Attorney, Agent, or Firm* — Oblon, Spivak, McClelland, Maier & Neustadt, L.L.P.

(57) ABSTRACT

Provided is a photocurable resin composition, which has sensitivity equal to or greater than existing compositions, has alkali development properties, and which produces a cured product that does not become brittle with changes in temperature, and which also has excellent reliability in terms of water resistance, electrical insulating properties, PCT resistance, and the like. The photocurable resin composition comprises a carboxyl group-containing resin, a photopolymerization initiator, a vinyl group-containing elastomer, and a styryl group-containing compound.

20 Claims, No Drawings

PHOTOCURABLE RESIN COMPOSITION

TECHNICAL FIELD

The present invention relates to a photocurable resin composition used for a solder resist or the like for a printed wiring board, for example.

BACKGROUND ART

A photocurable resin composition can be used for microfabrication by applying the principles of photography (photolithography). Further, since a cured product with excellent physical properties can be given, it is used for electronic devices, printed boards, or the like.

A photocurable resin composition includes a solvent development type and an alkali development type. From the viewpoint of environmental measures, an alkali development type allowing development with weak and dilute aqueous alkali solution is mostly used. For example, an alkali development type photocurable resin composition is used for production of a printed wiring board, production of a liquid crystal display panel, or production of a printing plate. When it is used as a solder resist for production of a printed wiring board, for example, the cured product thereof is required to have reliability characteristics like heat resistance to endure high temperature treatment like soldering, resistance to non-electrolysis gold plating, electrical properties, and PCT resistance. As a photocurable resin composition which satisfies, at least to some extent, resistance to migration and resistance to hot-cold cycle as a cured product, a photocurable resin in which many double bonds are introduced to a resin skeleton by using a polyfunctional epoxy resin or (meth)acrylate among carboxyl group-containing epoxy (meth)acrylate is used. It is believed that crosslinking density is increased according to such constitution, and therefore an improvement in heat resistance or dimension stability can be obtained.

Meanwhile, since a cured product becomes brittle as the crosslinking density increases, there is a problem that a balance between heat resistance and brittleness reduction is difficult to obtain. To deal with brittleness reduction problem, a method of using a mixture of bisphenol type carboxyl group-containing epoxy (meth)acrylate and Novolac type carboxyl group-containing epoxy (meth)acrylate is suggested (for example, see Patent Literature 1). However, the method focuses on an improvement of flexibility, and therefore it has a problem that dimension stability with changes in temperature or water resistance cannot be obtained at sufficient level.

According to an increase in the size of a board to which it is applied or to achieve a further improvement in production or the like, a resin composition having higher sensitivity is required in recent days. A polymer compound having a radical polymerizable vinyl group in the side chain can undergo a crosslinking reaction via polymerization of the side vinyl group to enable high-speed curing, and therefore an improvement in sensitivity is expected (for example, see Patent Literature 2 or the like). However, there is also a problem that it is not compatible with alkali developability.

CITATION LIST

Patent Literature

PLT 1: Japanese Patent Application Laid-Open No. 2000-109541
PLT 2: Japanese Patent No. 3654422

SUMMARY OF THE INVENTION

Technical Problem

The objective of the invention is to provide a photocurable resin composition, which has sensitivity equal to or greater than existing compositions and has alkali development properties, which produces a cured product that does not become brittle with changes in temperature, and which also has excellent reliability in terms of water resistance, electrical insulating properties, PCT resistance, and the like.

Solution to Problem

According to one embodiment of the invention, a photocurable resin composition characterized by containing a carboxyl group-containing resin, a photopolymerization initiator, a vinyl group-containing elastomer, and a styryl group-containing compound is provided.

According to the constitution described above, it becomes possible to obtain both the exposure sensitivity and alkali developability, and it is possible to obtain a cured product having good resistance to non-electrolysis gold plating, good electrical properties, and good PCT resistance.

Further, the photocurable resin composition according to one preferred embodiment of the invention preferably contains a mercapto compound. According to this constitution, adhesiveness can be improved.

Further, according to the photocurable resin composition according to one preferred embodiment of the invention, the carboxyl group-containing resin preferably contains a photosensitive group. By having a photosensitive group, a photocurability of the photocurable resin composition increases so that the sensitivity can be enhanced.

Further, according to the photocurable resin composition according to one preferred embodiment of the invention, the photopolymerization initiator is preferably a mixture of at least one photopolymerization initiator selected from the group consisting of an oxime ester-based photopolymerization initiator represented by the following formula (I), an aminoacetophenone-based photopolymerization initiator represented by the following formula (II), and an acylphosphine oxide-based photopolymerization initiator represented by the following formula (III).

[Chemical Formula 1]

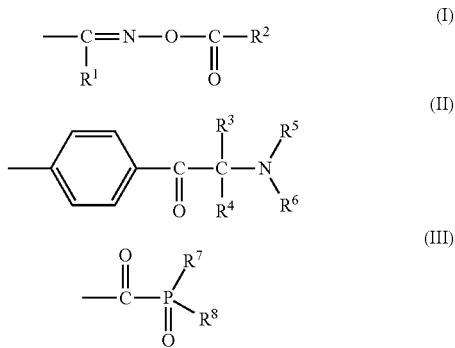

(in the formula, $R^1$ represents a hydrogen atom, a phenyl group (it may be substituted with an alkyl group having 1 to 6 carbon atoms, a phenyl group, or a halogen atom), an alkyl group having 1 to 20 carbon atoms (it may be substituted with one or more hydroxyl groups and the alkyl chain may be interrupted with one or more oxygen atoms), a cycloalkyl group having 5 to 8 carbon atoms, an alkanoyl group having 2 to 20 carbon atoms, or a benzoyl group (it may be substituted with an alkyl group having 1 to 6 carbon atoms or a phenyl group), $R^2$ represents a phenyl group (it may be substituted with an alkyl group having 1 to 6 carbon atoms, a phenyl group, or a halogen atom), an alkyl group having 1 to 20 carbon atoms (it may be substituted with one or more hydroxyl groups and the alkyl chain may be interrupted with one or more oxygen atoms), a cycloalkyl group having 5 to 8 carbon atoms, an alkanoyl group having 2 to 20 carbon atoms, or a benzoyl group (it may be substituted with an alkyl group having 1 to 6 carbon atoms or a phenyl group), $R^3$ and $R^4$ each independently represent an alkyl group or an arylalkyl group having 1 to 12 carbon atoms, $R^5$ and $R^6$ each independently represent a hydrogen atom, an alkyl group having 1 to 6 carbon atoms, or acyclic alkyl ether group in which two of them are bound to each other, $R^7$ and $R^8$ each independently represent a linear or branched alkyl group having 1 to 10 carbon atoms, a cyclohexyl group, a cyclopentyl group, an aryl group, or an aryl group substituted with a halogen atom, an alkyl group, or an alkoxy group, with the proviso that one of $R^7$ and $R^8$ may represent a R—C(=O)— group (wherein R represents a hydrocarbon group having 1 to 20 carbon atoms)).

By using the photopolymerization initiator, it is possible to obtain high resolution from a resist which contains a pigment at high concentration.

Further, according to the photocurable resin composition according to one preferred embodiment of the invention, it preferably contains a thermocurable component. By containing a thermocurable component, not only the heat resistance is obtained but also tensile elongation of a cured film is increased, and therefore crack resistance and punching resistance can be enhanced.

Further, in the photocurable resin composition according to one preferred embodiment of the invention, a colorant is preferably contained. By containing a colorant, the composition can be suitably used as a solder resist.

Further, by coating the photocurable resin composition according to one preferred embodiment of the invention on a film and drying, a dried film can be obtained. By using the dried film, a resist layer can be easily formed without coating the photocurable resin composition on a substrate.

Further, according to one preferred embodiment of the invention, the photocurable resin composition or the dried film described above can be used as a cured product that is obtained by irradiation of active energy ray.

When the cured product is used for a printed wiring board or the like, it is possible to improve PCT resistance without compromising characteristics like migration resistance.

Still further, according to one preferred embodiment of the invention, the photocurable resin composition or the dried film described above can be used as a printed wiring board having a pattern of cured product that is obtained by irradiation of active energy ray.

According to the printed wiring board, PCT resistance can be improved without compromising characteristics like migration resistance.

Advantageous Effects of Invention

According to a preferred embodiment of the invention, it is possible to obtain a photocurable resin composition which has sensitivity and alkali development properties equal to or greater than existing compositions, and which produces a cured product that does not become brittle with changes in temperature, and which also has excellent reliability in terms of water resistance, electrical insulating properties, PCT resistance, and the like.

DESCRIPTION OF EMBODIMENTS

Inventors of the invention found that the object described above can be achieved by using a photocurable resin composition containing a carboxyl group-containing resin, a photopolymerization initiator, a vinyl group-containing elastomer, and a styryl group-containing compound, and therefore completed the invention.

In particular, by using a vinyl group-containing elastomer, both the exposure sensitivity and alkali developability can be obtained. In addition, by imparting flexibility to a cured product, brittleness of the cured product can be improved. In addition, with crosslinking by a vinyl group, the crosslinking density is increased so that heat resistance and weather resistance can be improved.

Further, heat resistance can be given by the styryl compound.

Herein below, the photocurable resin composition of the preferred embodiment of the invention is explained in greater detail.

First, as carboxyl group-containing resin which constitutes the photocurable resin composition of the preferred embodiment of the invention, various known carboxyl group-containing resins which have a carboxyl group in the molecule may be used under the purpose of giving an alkali developability.

In particular, from the viewpoint of photocurability and resistance to development, a carboxyl group-containing photosensitive resin which has an ethylenically unsaturated double bond in the molecule is preferable. In addition, it is more preferable that the unsaturated double bond is derived from acrylic acid, methacrylic acid, or a derivative thereof.

Preferred examples of the carboxyl group-containing resin include the compounds described below (it may be any one of an oligomer and a polymer).

(1) A carboxyl group-containing resin which is obtained by copolymerization between an unsaturated carboxylic acid like (meth)acrylic acid and a compound containing an unsaturated group like styrene, α-methylstyrene, lower alkyl (meth)acrylate, and isobutylene.

(2) A urethane resin containing a carboxyl group which is obtained by polyaddition of diisocyanate like aliphatic diisocyanate, branched aliphatic diisocyanate, alicyclic diisocyanate, and aromatic diisocyanate with a diol compound including a dialcohol compound containing a carboxyl group like dimethylol propionic acid and dimethylol butanoic acid, and polycarbonate-based polyol, polyether-based polyol, polyester-based polyol, polyolefin-based polyol, acryl-based polyol, bisphenol A type alkylene oxide adduct diol, and a compound having a phenolic hydroxyl group and an alcoholic hydroxyl group.

(3) A photosensitive urethane resin containing a carboxyl group which is obtained by polyaddition of diisocyanate with (meth)acrylate or partial acid anhydride-modified product of a bifunctional epoxy resin like bisphenol A type epoxy resin, hydrogenated bisphenol A type epoxy resin, bisphenol F type epoxy resin, bisphenol S type epoxy resin, bixylenol type epoxy resin and biphenol type epoxy resin, a dialcohol compound containing a carboxyl group, and a diol compound.

(4) A photosensitive urethane resin containing a carboxyl group obtained by adding, during synthesis of the resin (2) or (3) above, a compound having one hydroxyl group and at least one (meth)acryl group in the molecule like hydroxyalkyl (meth)acrylate to have a terminal (meth)acrylate.

(5) A photosensitive urethane resin containing a carboxyl group obtained by adding, during synthesis of the resin (2) or (3) above, a compound having one isocyanate group and at least one (meth)acryl group in the molecule like molar reactant between isophorone diisocyanate and pentaerythritol triacrylate to have a terminal (meth)acrylate.

(6) A photosensitive carboxyl group-containing resin obtained by reacting a bifunctional or polyfunctional (solid) epoxy resin described below with (meth)acrylic acid and adding to the hydroxyl group in the side chain a dibasic acid anhydride.

(7) A photosensitive carboxyl group-containing resin obtained by reacting a polyfunctional epoxy resin, in which hydroxyl group of a bifunctional (solid) epoxy resin is further epoxylated with epichlorohydrin as described below, with (meth)acrylic acid and adding to the hydroxyl group generated a dibasic acid anhydride.

(8) A carboxyl group-containing polyester resin obtained by reacting a bifunctional oxetane resin described below with dicarboxylic acid and adding dibasic acid anhydride to the primary hydroxyl group generated.

(9) A photosensitive carboxyl group-containing resin obtained by reacting a reaction product obtained by reacting a compound having plural phenolic hydroxyl groups in the molecule with alkylene oxide like ethylene oxide and propylene oxide with monocarboxylic acid containing an unsaturated group and by reacting the reaction product obtained with polybasic acid anhydride.

(10) A photosensitive carboxyl group-containing resin obtained by reacting a reaction product obtained by reacting a compound having plural phenolic hydroxyl groups in the molecule with a cyclic carbonate compound like ethylene carbonate and propylene carbonate with monocarboxylic acid containing an unsaturated group and by reacting the reaction product obtained with polybasic acid anhydride.

(11) A photosensitive carboxyl group-containing resin obtained by adding a compound having one epoxy group and at least one (meth)acryl group in the molecule to the resins of (1) to (10) above.

As used herein, the term "(meth)acrylate" includes acrylate, methacrylate, and a mixture thereof. The same holds true for other similar expressions.

In the carboxyl group-containing resin, many free carboxyl groups are present in the backbone • side chain of the polymer to enable development by a dilute aqueous alkali solution.

Acid value of the carboxyl group-containing resin is preferably 40 to 200 mgKOH/g. When the acid value of the carboxyl group-containing resin is less than 40 mgKOH/g, it is difficult to achieve alkali development. On the other hand, when it is more than 200 mgKOH/g, an exposed section is dissolved by a development liquid, yielding unnecessarily thin lines. As a result, the exposed section and unexposed section are all dissolved and released by a development liquid depending on a case, and thus it becomes difficult to write a normal resist pattern. More preferably, the acid value is 45 to 120 mgKOH/g.

Further, although it may vary depending on resin skeleton, in general, weight average molecular weight of the carboxyl group-containing resin is preferably 2,000 to 150,000. When the weight average molecular weight is less than 2,000, a tack-free property may be lowered so that moisture resistance of a coating film is poor after exposure and developability may be significantly lowered due to film loss during development. On the other hand, when the weight average molecular weight is more than 150,000, developability may be significantly lowered and storage stability tends to deteriorate. The weight average molecular weight is more preferably 5,000 to 100,000.

Addition amount of the carboxyl group-containing resin is appropriately 20 to 60% by weight in a photocurable resin composition. When the addition amount is less than 20% by weight, film strength is weakened. On the other hand, when it is more than 60% by weight, the composition has higher viscosity, yielding poorer coatability or the like. The addition amount is more preferably 30 to 50% by weight.

The carboxyl group-containing resin is not limited to those described above, and it may be used either singly or in combination of two or more.

As a photopolymerization initiator, at least one photopolymerization initiator selected from a group consisting of an oxime ester-based photopolymerization initiator having a group represented by the following formula (I), an α-aminoacetophenone-based photopolymerization initiator having a group represented by the following formula (II), and/or an acylphosphine oxide-based photopolymerization initiator having a group represented by the following formula (III) is used, and thus it is possible to obtain good resolution from a resist which contains a pigment at high concentration.

[Chemical Formula 2]

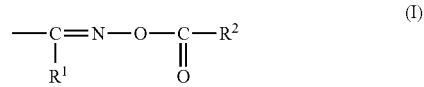

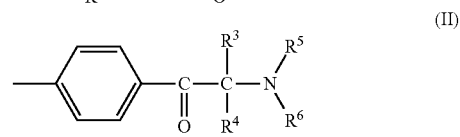

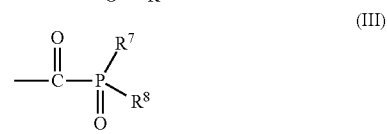

(in the formula, $R^1$ represents a hydrogen atom, a phenyl group (it may be substituted with an alkyl group having 1 to 6 carbon atoms, a phenyl group, or a halogen atom), an alkyl group having 1 to 20 carbon atoms (it may be substituted with one or more hydroxyl groups and the alkyl chain may be interrupted with one or more oxygen atoms), a cycloalkyl group having 5 to 8 carbon atoms, an alkanoyl group having 2 to 20 carbon atoms, or a benzoyl group (it may be substituted with an alkyl group having 1 to 6 carbon atoms or a phenyl group), $R^2$ represents a phenyl group (it may be substituted with an alkyl group having 1 to 6 carbon atoms, a phenyl group, or a halogen atom), an alkyl group having 1 to 20 carbon atoms (it may be substituted with one or more hydroxyl groups and the alkyl chain may be interrupted with one or more oxygen atoms), a cycloalkyl group having 5 to 8 carbon atoms, an alkanoyl group having 2 to 20 carbon atoms, or a benzoyl group (it may be substituted with an alkyl group having 1 to 6 carbon atoms or a phenyl group), $R^3$ and $R^4$ each independently represent an alkyl group or an arylalkyl group having 1 to 12 carbon atoms, $R^5$ and $R^6$ each independently represent a hydrogen atom, an alkyl group having 1 to 6 carbon atoms, or a cyclic alkyl ether group in which two of them are bound to each other, $R^7$ and $R^8$ each independently represent a linear or branched alkyl group having 1 to 10 carbon atoms, a cyclohexyl group, a cyclopentyl group, an aryl group, or an aryl group substituted with a halogen atom, an alkyl group, or an alkoxy group, with the proviso that one of $R^7$ and $R^8$ may represent a R—C(=O)— group (wherein R represents a hydrocarbon group having 1 to 20 carbon atoms)).

Preferred examples of the oxime ester-based photopolymerization initiator having a group represented by the formula (I) include 2-(acetyloxyiminomethyl)thioxanthen-9-one represented by the following formula (IV), a compound represented by the following formula (V), and a compound represented by the following formula (VI).

[Chemical Formula 3]

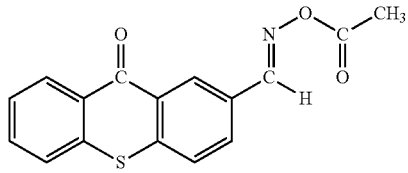

(IV)

[Chemical Formula 4]

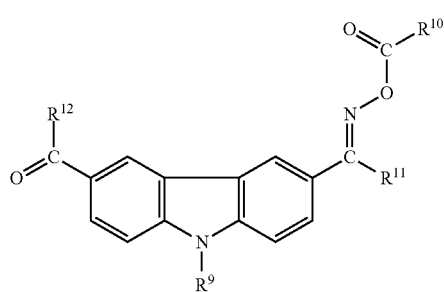

(V)

(in the formula, $R^9$ represents a hydrogen atom, a halogen atom, an alkyl group having 1 to 12 carbon atoms, a cyclopentyl group, a cyclohexyl group, a phenyl group, a benzyl group, a benzoyl group, an alkanoyl group having 2 to 12 carbon atoms, an alkoxycarbonyl group having 2 to 12 carbon atoms (when the alkyl group constituting the alkoxy group has two or more carbon atoms, the alkyl group may be substituted with one or more hydroxyl groups and the alkyl chain may be interrupted with one or more oxygen atoms), or a phenoxycarbonyl group, $R^{10}$ and $R^{12}$ each independently represent a phenyl group (it may be substituted with an alkyl group having 1 to 6 carbon atoms, a phenyl group, or a halogen atom), an alkyl group having 1 to 20 carbon atoms (it may be substituted with one or more hydroxyl groups and the alkyl chain may be interrupted with one or more oxygen atoms), a cycloalkyl group having 5 to 8 carbon atoms, an alkanoyl group having 2 to 20 carbon atoms, or a benzoyl group (it may be substituted with an alkyl group having 1 to 6 carbon atoms or a phenyl group), and $R^{11}$ represents a hydrogen atom, a phenyl group (it may be substituted with an alkyl group having 1 to 6 carbon atoms, a phenyl group, or a halogen atom), an alkyl group having 1 to 20 carbon atoms (it may be substituted with one or more hydroxyl groups and the alkyl chain may be interrupted with one or more oxygen atoms), a cycloalkyl group having 5 to 8 carbon atoms, an alkanoyl group having 2 to 20 carbon atoms, or a benzoyl group (it may be substituted with an alkyl group having 1 to 6 carbon atoms or a phenyl group))

[Chemical Formula 5]

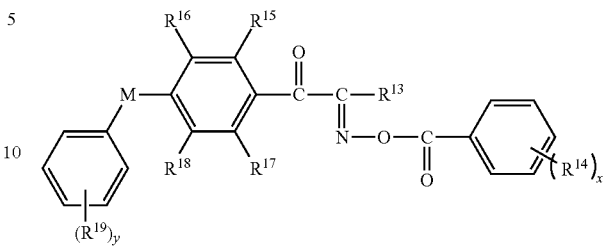

(VI)

(in the formula, $R^{13}$, $R^{14}$ and $R^{19}$ each independently represent an alkyl group having 1 to 12 carbon atoms, $R^{15}$, $R^{16}$, $R^{17}$ and $R^{18}$ each independently represent a hydrogen atom or an alkyl group having 1 to 6 carbon atoms, M represents O, S or NH, and x and y each independently represent an integer of 0 to 5).

Among the oxime ester-based photopolymerization initiators, 2-(acetyloxyiminomethyl)thioxanthen-9-one represented by the formula (I) and the compound represented by the formula (V) are more preferable. Examples of the commercially available product include CGI-325, Irgacure (registered trademark) OXE01, Irgacure OXE02 manufactured by Ciba Japan K.K. and N-1919 manufactured by ADEKA CORPORATION. The oxime ester-based photopolymerization initiator may be used either singly or in combination of two or more.

Examples of the α-aminoacetophenone-based photopolymerization initiator having a group represented by the formula (II) include 2-methyl-1-[4-(methylthio)phenyl]-2-morpholinopropanone-1,2-benzyl-2-dimethylamino-1-(4-morpholinophenyl)-butan-1-one, 2-(dimethylamino)-2-[(4-methylphenyl)methyl]-1-[4-(4-morpholinyl)phenyl]-1-butanone, and N,N-dimethylaminoacetophenone. Examples of the commercially available product include Irgacure 907, Irgacure 369, Irgacure 379 manufactured by Ciba Japan K.K.

Examples of the acylphopsphine oxide-based photopolymerization initiator having a group represented by the formula (III) include 2,4,6-trimethylbenzoyldiphenylphosphine oxide, bis(2,4,6-trimethylbenzoyl)-phenylphosphine oxide, and bis(2,6-dimethoxybenzoyl)-2,4,4-trimethyl-pentylphosphine oxide. Examples of the commercially available product include Lucirin TPO manufactured by BASF Ltd. and Irgacure 819 manufactured by Ciba Japan K.K.

Addition amount of the photopolymerization initiator is preferably 0.01 to 30 parts by weight compared to 100 parts by weight of the carboxyl group-containing resin. When the addition amount of the photopolymerization initiator is less than 0.01 part by weight, photocurability on copper is insufficient to cause peeling of a coating film and also characteristics of a coating film like chemical resistance or the like are deteriorated. On the other hand, when it is greater than 30 parts by weight, light absorption of the photopolymerization initiator on surface of a solder resist coating film is so strong that deep curing property tends to decrease. More preferably, the addition amount is 0.5 to 15 parts by weight.

Addition amount of the oxime ester-based photopolymerization initiator having a group represented by the following formula (I) is preferably 0.01 to 20 parts by weight, and more preferably 0.01 to 5 parts by weight compared to 100 parts by weight of the carboxyl group-containing resin.

In addition to the above, examples of a photopolymerization initiator, a photo initiation aid, and a sensitizer that can be suitably used for the photocurable resin composition of the preferred embodiment of the invention include a benzoin compound, an acetophenone compound, an anthraquinone compound, a thioxanthone compound, a ketal compound, a benzophenone compound, a xanthone compound, and a tertiary amine compound.

Specific examples of the benzoin compound include benzoin, benzoin methyl ether, benzoin ethyl ether, and benzoin isopropyl ether.

Specific examples of the acetophenone compound include acetophenone, 2,2-dimethoxy-2-phenylacetophenone, 2,2-diethoxy-2-phenylacetophenone, and 1,1-dichloroacetophenone.

Specific examples of the anthraquinone compound include 2-methylanthraquinone, 2-ethylanthraquinone, 2-t-butylanthraquinone, and 1-chloroanthraquinone.

Specific examples of the thioxanthone compound include 2,4-dimethylthioxanthone, 2,4-diethylthioxanthone, 2-chlorothioxanthone, and 2,4-diisopropylthioxanthone.

Specific examples of the ketal compound include acetophenone dimethyl ketal and benzyl dimethyl ketal.

Specific examples of the benzophenone compound include benzophenone, 4-benzoyldiphenyl sulfide, 4-benzoyl-4'-methyldiphenyl sulfide, 4-benzoyl-4'-ethyldiphenyl sulfide, and 4-benzoyl-4'-propyldiphenyl sulfide.

Specific examples of the tertiary amine compound include an ethanolamine compound, a compound having a dialkylaminobenzene structure, and examples thereof include dialkylaminobenzophenone like 4,4'-dimethylaminobenzophenone (Nisso Cure MABP, manufactured by Nippon Soda Co., Ltd.) and 4,4'-diethylaminobenzophenone (EAB, manufactured by HODOGAYA CHEMICAL CO., LTD.); a coumarin compound containing a dialkylamino group like 7-(diethylamino)-4-methyl-2H-1-benzopyran-2-one (7-(diethylamino)-4-methylcoumarin), and; dialkylamino benzoic acid ester like ethyl 4-dimethylamino benzoate (KAYACURE (registered trademark) EPA, manufactured by Nippon Kayaku Co., Ltd.), ethyl 2-dimethylamino benzoate (Quantacure DMB, manufactured by International Bio-synthetics Ltd.), (n-butoxy)ethyl 4-dimethylamino benzoate (Quantacure BEA, manufactured by International Bio-synthetics Ltd.), p-dimethylamino benzoic acid isoamyl ethyl ester (KAYACURE DMBI, manufactured by Nippon Kayaku Co., Ltd.), and 2-ethylhexyl 4-dimethylamino benzoate (ESOLOL 507, manufactured by Van Dyk).

In particular, a compound having a dialkylaminobenzene structure is preferable. Among them, a dialkylaminobenzophenone compound and a coumarin compound containing a dialkylamino group with maximum absorption wavelength of 350 to 410 nm are particularly preferable. As a dialkylaminobenzophenone compound, 4,4'-diethylaminobenzophenone is preferable as it has low toxicity. As the coumarin compound containing a dialkylamino group has maximum absorption wavelength of 350 to 410 nm, which is within a UV range, it can provide a colorless and transparent photosensitive composition and also, by using a coloring pigment, a colored solder resist film in which the color of the coloring pigment itself is reflected can be provided. In particular, 7-(diethylamino)-4-methyl-2H-1-benzopyran-2-one is preferable in that it shows an excellent sensitizing effect for laser beam with wavelength of 400 to 410 nm.

Of these, the thioxanthone compounds and the tertiary amine compounds are preferable. In particular, it is preferable for the composition of the preferred embodiment of the invention to contain the thioxanthone compound from the viewpoint of deep curability. Among them, it is preferable to contain the thioxanthone compound like 2,4-dimethylthioxanthone, 2,4-diethylthioxanthone, 2-chlorothioxanthone, and 2,4-diisopropylthioxanthone.

Addition amount of the thioxanthone compound is preferably 20 parts by weight or less compared to 100 parts by weight of the carboxyl group-containing resin. When the addition amount of the thioxanthone compound is more than 20 parts by weight, thick film curability is lowered and also production cost increases. More preferably, it is 10 parts by weight or less.

Addition amount of the tertiary amine compound is preferably 0.1 to 20 parts by weight compared to 100 parts by weight of the carboxyl group-containing resin. When the addition amount of the tertiary amine compound is less than 0.1 parts by weight, it appears to be difficult to obtain a sufficient sensitizing effect. When it is more than 20 parts by weight, light absorption by a tertiary amine compound on surface of a dried solder resist coating film is so strong that deep curing property tends to decrease. The addition amount is more preferably 0.1 to 10 parts by weight. The photopolymerization initiator, photoinitiation aid, and sensitizer may be used either singly or in combination of two or more.

Total amount of the photopolymerization initiator, photoinitiation aid, and sensitizer is preferably 35 parts by weight or less compared to 100 parts by weight of the carboxyl group-containing resin. When it is more than 35 parts by weight, deep curing property tends to decrease due to light absorption by them.

For the photocurable resin composition of the preferred embodiment of the invention, N phenyl glycines, phenoxyacetic acids, thiophenoxy acetic acids, and mercaptothiazole and the like that are well known in the field may be used as a chain transfer agent to enhance the sensitivity of the composition. Specific examples of the chain transfer agent include mercaptosuccinic acid, mercaptoacetic acid, mercaptopropionic acid, methionine, cysteine, thiosalicylic acid and derivatives thereof. The chain transfer agent may be used either singly or in combination of two or more.

The vinyl group-containing elastomer used for the photocurable resin composition of the preferred embodiment of the invention enables obtainment of both the exposure sensitivity and alkali developability, and by giving flexibility to a cured product of the photocurable resin composition, it is used for improving brittleness of a cured product. Further, according to generation of crosslinking caused by a vinyl group, crosslinking density is increased, and therefore heat resistance and weather resistance can be enhanced.

The vinyl group-containing elastomer used for the photocurable resin composition of the preferred embodiment of the invention is not specifically limited, if it is an elastomer containing a vinyl group. Examples of the commercially available product include R-45HT, Poly bd HTP-9 (all manufactured by Idemitsu Kosan Co., Ltd.), Epolead (registered trademark) PB3600 (DAICEL CHEMICAL INDUSTRIES, LTD.), DENAREX (registered trademark) R-45 EPT (Nagase ChemteX Corporation), and Ricon (registered trademark) 130, Ricon 131, Ricon 134, Ricon 142, Ricon 150, Ricon 152, Ricon 153, Ricon 154, Ricon 156, Ricon 157, Ricon 100, Ricon 181, Ricon 184, Ricon 130 MA8, Ricon 130 MA13, Ricon 130 MA20, Ricon 131 MA5, Ricon 131 MA10, Ricon 131 MA17, Ricon 131 MA20, Ricon 184 MA6, Ricon 156 MA17 (all manufactured by Sartomer Company Inc.). The vinyl group-containing elastomer may be used either singly or in combination of two or more.

Addition amount of the vinyl group-containing elastomer is preferably 3 to 100 parts by weight compared to 100 parts by weight of the carboxyl group-containing resin. When the addition amount is less than 3 parts by weight, sufficient flexibility or stress relaxation cannot be obtained. On the other hand, when it is more than 100 parts by weight, the developability of the composition is lowered, and therefore it becomes difficult to obtain good developability. More preferably, it is 10 to 60 parts by weight.

The styryl compound that can be used for the photocurable resin composition of the preferred embodiment of the invention is used for obtaining heat resistance. The styryl group-containing compound can be synthesized according to a method well known in the field, or a commercially available product can be used. Examples of the method for synthesizing the styryl group-containing compound include a reaction between mono • polyfunctional phenols and halogenated methylstyrene and a reaction between mono • polyfunctional compounds which have a functional group capable of reacting with an epoxy group (e.g., an amino group, a hydroxyl group, and a carboxyl group) and vinylbenzyl glycidyl ether.

Specific examples of the styryl compound include a polyvinyl benzyl ether compound obtained by reaction between vinyl naphthalene, divinyl naphthalene, divinylbiphenyl, polyphenol, and vinyl benzyl halide, an oligophenylene ether compound having a terminal styrene (trade name: OPE-2St, manufactured by Mitsubishi Gas Chemical Company, Inc.), and a compound obtained by reaction between bisphenol A and vinyl benzyl halide (Ripoxy (registered trademark) BPV-1X, manufactured by SHOWA HIGHPOLYMER CO., LTD.). The styryl group-containing compound may be used either singly or in combination of two or more.

Addition amount of the styryl group-containing compound is preferably 1 to 50 parts by weight compared to 100 parts by weight of the carboxyl group-containing resin. When the addition amount is less than 1 part by weight, sufficient heat resistance cannot be obtained. On the other hand, when it is more than 50 parts by weight, the development residues are generated. More preferably, it is 1 to 10 parts by weight.

For the purpose of enhancing curability and adhesion between a cured product obtained and a substrate, the photocurable resin composition of the preferred embodiment of the invention may be added with an additive agent, a chain transfer agent, and/or a mercapto compound which functions as an agent for giving adhesiveness.

Examples of the mercapto compound include a chain transfer agent having a hydroxyl group like mercaptoethanol, mercaptopropanol, mercaptobutanol, mercaptopropane diol, mercaptobutane diol, hydroxybenzene thiol and derivatives thereof and; 1-butanethiol, butyl-3-mercaptopropionate, methyl-3-mercaptopropionate, 2,2-(ethylenedioxy)diethanethiol, ethanethiol, 4-methylbenzene thiol, dodecylmercaptan, propane thiol, butane thiol, pentane thiol, 1-octane thiol, cyclopentane thiol, cyclohexane thiol, thioglycerol, and 4,4-thiobisbenzene thiol.

Examples of the commercially available product include BMPA, MPM, EHMP, NOMP, MBMP, STMP, TMMP, PEMP, DPMP, and TEMPIC (all manufactured by Sakai Chemical Industry Co., Ltd.), Karenz MT (registered trademark)-PE1, Karenz MT-BD1, and Karenz (registered trademark)-NR1 (all manufactured by Showa Denko K.K.).

Further, a mercapto compound having a heterocycle can be used, and specific examples thereof include mercapto-4-butyrolactone (other name: 2-mercapto-4-butanolide), 2-mercapto-4-methyl-4-butyrolactone, 2-mercapto-4-ethyl-4-butyrolactone, 2-mercapto-4-butyrothiolactone, 2-mercapto-4-butyrolactam, N-methoxy-2-mercapto-4-butyrolactam, N-ethoxy-2-mercapto-4-butyrolactam, N-methyl-2-mercapto-4-butyrolactam, N-ethyl-2-mercapto-4-butyrolactam, N-(2-methoxy)ethyl-2-mercapto-4-butyrolactam, N-(2-ethoxy)ethyl-2-mercapto-4-butyrolactam, 2-mercapto-5-valerolactone, 2-mercapto-5-valerolactam, N-methyl-2-mercapto-5-valerolactam, N-ethyl-2-mercapto-5-valerolactam, N-(2-methoxy)ethyl-2-mercapto-5-valerolactam, N-(2-ethoxy)ethyl-2-mercapto-5-valerolactam, 2-mercaptobenzothiazole, 2-mercapto-5-methylthio-thiadiazole, 2-mercapto-6-hexanolactam, 2,4,6-trimercapto-s-triazine (Zisnet (registered trademark) F manufactured by Sankyo Kasei Co., Ltd.), 2-dibutylamino-4,6-dimercapto-s-triazine (trade name: ZISNET DB, manufactured by Sankyo Kasei Co., Ltd.), and 2-anilino-4,6-dimercapto-s-triazine (trade name: ZISNET AF, manufactured by Sankyo Kasei Co., Ltd.).

In particular, as a mercapto compound having a heterocycle which does not inhibit the developability of the photocurable resin composition, 2-mercaptobenzimidazole, 2-mercaptobenzoxazole, 2-mercaptobenzothiazole (trade name: ACCEL M, manufactured by Kawaguchi Chemical Industry Co., Ltd.), 3-mercapto-4-methyl-4H-1,2,4-triazole, 5-methyl-1,3,4-thiadiazole-2-thiol, and 1-phenyl-5-mercapto-1H-tetrazole are preferable. The mercapto compound may be used either singly or in combination of two or more.

To give heat resistance to the photocurable resin composition of the preferred embodiment of the invention, it is possible to add a thermocurable component. Examples of the thermocurable component that is used in the invention include an amine resin like a melamine resin, a benzoguanamine resin, melamine derivatives, and benzoguanamine derivatives, and a thermocurable resin well known in the field including a blocked isocyanate compound, a cyclocarbonate compound, a polyfunctional epoxy compound, a polyfunctional oxetane compound, and an episulfide resin. Particularly preferred is a thermocurable component which has two or more cyclic ether groups and/or cyclic thio ether groups (herein below, abbreviated as "cyclic (thio)ether group") in the molecule.

Such thermocurable component having plural cyclic (thio) ether groups in the molecule is a compound which has plural groups that are at least one type of a 3-, 4-, or 5-membered cyclic (thio)ether group in the molecule. Examples thereof include a compound having plural epoxy groups in the molecules, i.e., a polyfunctional epoxy compound, a compound having plural oxetanyl groups in the molecules, i.e., a polyfunctional oxetane compound, and a compound having plural thio ether groups in the molecules, i.e., an episulfide resin.

Examples of the polyfunctional epoxy compound include bisphenol A type epoxy resin including jER (registered trademark) 828, jER834, jER1001, and jER1004 (all manufactured by Mitsubishi Chemical Corporation), EPICLON (registered trademark) 840, EPICLON850, EPICLON1050, and EPICLON2055 (all manufactured by DIC Corporation), EPOTOHTO (registered trademark) YD-011, YD-013, YD-127, and YD-128 (all manufactured by Nippon Steel Chemical Co., Ltd.), D.E.R. 317, D.E.R. 331, D.E.R. 661, and D.E.R. 664 (all manufactured by The Dow Chemical Company), ARALDITE 6071, ARALDITE 6084, ARALDITE GY250, and ARALDITE GY260 (all manufactured by Ciba Japan, K.K.), SUMI-EPDXY ESA-011, ESA-014, ELA-115, and ELA-128 (all manufactured by Sumitomo Chemical Co. Ltd.), A.E.R. 330, A.E.R. 331, A.E.R. 661, and A.E.R. 664 (all manufactured by Asahi Kasei Corporation); a brominated epoxy resin including jERYL903 (manufactured by Mitsubishi Chemical Corporation), EPICLON 152 and EPICLON 165 (all manufactured by DIC Corporation), EPOTOHTO YDB-400 and YDB-500 (all manufactured by Nippon Steel Chemical Co., Ltd.), D.E.R. 542 (manufactured by The Dow Chemical Company), ARALDITE 8011 (manufactured by Ciba Japan, K.K.), SUMI-EPDXY ESB-400 and ESB-700 (all manufactured by Sumitomo Chemical Co. Ltd.), and A.E.R. 711 and A.E.R. 714 (all manufactured by Asahi Kasei Corporation); a Novolac type epoxy resin including jER152 and jER154 (all manufactured by Mitsubishi Chemical Corporation), D.E.N. 431 and D.E.N. 438 (all manufactured by The Dow Chemical Company), EPICLON N-730, EPICLON N-770, and EPICLON N-865 (all manufactured by DIC Corporation), EPOTOHTO YDCN-701 and YDCN-704 (all manufactured by Nippon Steel Chemical Co., Ltd.), ARALDITE ECN1235, ARALDITE ECN1273, ARALDITE ECN1299, and ARALDITE XPY307 (all manufactured by Ciba Japan, K.K.), EPPN-201, EOCN (registered trademark)-1025, EOCN-1020, EOCN-1045, and RE-306 (all manufactured by Nippon Kayaku Co., Ltd.), SUMI-EPDXY ESCN-195× and ESCN-220 (all manufactured by Sumitomo Chemical Co. Ltd.), and A.E.R. ECN-235 and ECN-299 (all manufactured by Asahi Kasei Corporation); a bisphenol F type epoxy resin including EPICLON 830 (manufactured by DIC CORPORATION), jER807 (manufactured by Mitsubishi Chemical Corporation), EPOTOHTO YDF-170, YDF-175, YDF-2004 (all manufactured by Nippon Steel Chemical Co., Ltd.), ARALDITE XPY306 (manufactured by Ciba Japan, K.K.); hydrogenated bisphenol A type epoxy resin including EPOTOHTO ST-2004, ST-2007, ST-3000 (all manufactured by Nippon Steel Chemical Co., Ltd.); a glycidylamine type epoxy resin including jER604 (manufactured by Mitsubishi Chemical Corporation), EPOTOHTO YH-434 (manufactured by Nippon Steel Chemical Co., Ltd.), ARALDITE MY720 (manufactured by Ciba Japan, K. K.), and SUMI-EPDXY ELM-120 (manufactured by Sumitomo Chemical Co. Ltd.); a hydantoin type epoxy resin including ARALDITE CY-350 (manufactured by Ciba Japan, K.K.); an alicyclic epoxy resin including CELLOXIDE (registered trademark) 2021 (manufactured by DAICEL CHEMICAL INDUSTRIES, LTD.), ARALDITE CY175 and CY179 (all manufactured by Ciba Japan, K.K.); a trihydroxyphenylmethane type epoxy resin including YL-933 (manufactured by Mitsubishi Chemical Corporation), T.E.N., EPPN (registered trademark)-501, and EPPN-502 (all manufactured by Nippon Kayaku Co., Ltd.); a bixylenol type or biphenol type epoxy resin including YL-6056, YX-4000, and YL-6121 (all manufactured by Mitsubishi Chemical Corporation), and a mixture thereof; a bisphenol S type epoxy resin including EBPS-200 (manufactured by Nippon Kayaku Co., Ltd.), EPX-30 (manufactured by ADEKA CORPORATION), and EXA-1514 (manufactured by DIC Corporation); a bisphenol A Novolac type epoxy resin including jER157S (manufactured by Mitsubishi Chemical Corporation); a tetraphenylolethane type epoxy resin including jERYL-931 (manufactured by Mitsubishi Chemical Corporation) and ARALDITE 163 (manufactured by Ciba Japan, K.K.); a heterocycle type epoxy resin including ARALDITE PT810 (manufactured by Ciba Japan, K.K.) and TEPIC (manufactured by Nissan Chemical Industries, Ltd.); a diglycidyl phthalate resin including BLEMMER (registered trademark) DGT (manufactured by NOF CORPORATION); a tetraglycidyl xylenoylethane resin including ZX-1063 (manufactured by Nippon Steel Chemical Co., Ltd.); an epoxy resin containing a naphthalene group including ESN-190 and ESN-360 (all manufactured by Nippon Steel Chemical Co., Ltd.) and HP-4032, EXA-4750 and EXA-4700 (all manufactured by DIC Corporation); an epoxy resin having a dicyclopentadiene skeleton including HP-7200 and HP-7200H (all manufactured by DIC Corporation); a glycidylmethacrylate copolymerization-based epoxy resin including CP-50S and CP-50M (all manufactured by NOF CORPORATION); a copolymerization epoxy resin between cyclohexylmaleimide and glycidylmethacrylate; an epoxy modified polybutadiene rubber derivative (including PB-3600 manufactured by DAICEL CHEMICAL INDUSTRIES, LTD.), and CTBN modified epoxy resin (including YR-102 and YR-450 manufactured by Nippon Steel Chemical Co., Ltd.), but are not limited thereto. The epoxy resin may be used either singly or in combination of two or more. Among them, a Novolac type epoxy resin, a heterocycle type epoxy resin, a bisphenol A type epoxy resin, and a mixture thereof are particularly preferable.

Specific examples of the polyfunctional oxetane compound include polyfunctional oxetanes like bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and an oligomer or copolymer thereof, and also etherified product between oxetane alcohol and a Novolac resin or a resin having a hydroxyl group like poly(p-hydroxystyrene), cardo type bisphenols, calixarenes, calixresorcinarenes, or silsesquioxane. In addition to them, a copolymer having an unsaturated monomer having an oxetane ring and alkyl(meth)acrylate is also included.

Specific examples of the compound having plural cyclic thioether groups in the molecule include a bisphenol A type episulfide resin YL7000 manufactured by Mitsubishi Chemical Corporation. Further, an episulfide resin in which the oxygen atom in the epoxy group of a Novolac type epoxy resin is replaced with a sulfur atom according to the same synthetic method can be also used.

The addition amount of the thermocurable component having plural cyclic (thio)ether groups in the molecule is preferably 0.6 to 2.5 eq. compared to 1 eq. of the carboxyl group in the carboxyl group-containing resin. When the addition amount of the thermocurable component having plural cyclic (thio)ether groups in the molecule is less than 0.6 eq., the carboxyl groups remain on a solder resist film to lower heat resistance, alkali resistance, and electrical insulating property. On the other hand, when it is more than 2.5 eq., a cyclic (thio)ether group with low molecular weight remains on a dried coating film to lower the strength of a coating film, etc. The addition amount is more preferably 0.8 to 2.0 eq.

Examples of the thermocurable resin include an amine resin like melamine derivatives and benzoguanamine derivative, or the like. Specific examples include a methylol melamine compound, a methylol benzoguanamine compound, a methylol glycol uryl compound, and a methylol urea compound.

Further, an alkoxymethylated melamine compound, an alkoxymethylated benzoguanamine compound, an alkoxymethylated glycol uryl compound, and an alkoxymethylated urea compound are obtained by converting the methylol group of each of a methylol melamine compound, a methylol benzoguanamine compound, a methylol glycol uryl compound, and a methylol urea compound to an alkoxymethyl group. Type of the alkoxymethyl group is not specifically limited. Examples thereof include a methoxymethyl group, an ethoxymethyl group, a propoxymethyl group, and a butoxymethyl group. Formalin with concentration of 0.2% or less, which is mild to be used for a human or an environment, is particularly preferable.

Specific examples of a commercially available product thereof include CYMEL (registered trademark) 300, CYMEL 301, CYMEL 303, CYMEL 370, CYMEL 325, CYMEL 327, CYMEL 701, CYMEL 266, CYMEL 267, CYMEL 238, CYMEL 1141, CYMEL 272, CYMEL 202, CYMEL 1156, CYMEL 1158, CYMEL 1123, CYMEL 1170, CYMEL 1174, CYMEL UFR65, and CYMEL UFR300 (all manufactured by Mitsui Cyanamid Co. Ltd.), NIKALAC (registered trademark) Mx-750, NIKALAC Mx-032, NIKALAC Mx-270, NIKALAC Mx-280, NIKALAC Mx-290, NIKALAC Mx-706, NIKALAC Mx-708, NIKALAC Mx-40, NIKALAC Mx-31, NIKALAC Ms-11, NIKALAC Mw-30, NIKALAC Mw-30 HM, NIKALAC Mw-390, NIKALAC Mw-100 LM, and NIKALAC Mw-750 LM (all manufactured by Sanwa Chemical Co., Ltd.). The thermocurable component may be used either singly or in combination of two or more.

The photocurable resin composition according to the preferred embodiment of the invention may be added with a compound having plural isocyanate groups or blocked isocyanate groups in the molecule to enhance the curability and toughness of a cured film obtained. Examples of the compound having plural isocyanate groups or blocked isocyanate groups in the molecule include a polyisocyanate compound and a blocked isocyanate compound. The blocked isocyanate group is a temporarily inactivated group which is obtained by protection of an isocyanate group via a reaction with a blocking agent. When the blocked isocyanate group is heated to a pre-determined temperature, the blocking agent is dissociated to yield an isocyanate group.

Examples of the polyisocyanate compound that can be used include aromatic polyisocyanate, aliphatic polyisocyanate, and alicyclic polyisocyanate.

Specific examples of the aromatic polyisocyanate include 4,4'-diphenylmethanediisocyanate, 2,4-tolylenediisocyanate, 2,6-tolylenediisocyanate, naphthalene-1,5-diisocyanate, o-xylene diisocyanate, m-xylene diisocyanate, and a 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate), and isophorone diisocyanate.

Specific examples of the alicyclic polyisocyanate include bicycloheptane triisocyanate. Further, an adduct, a biurete product, and isocyanurate product of the isocyanate compounds described above are also included.

As a blocked isocyanate compound, an addition reaction product between an isocyanate compound and an isocyanate blocking agent is used. Examples of the isocyanate compound which can react with a blocking agent include the polyisocyanate compounds described above.

Specific examples of the isocyanate blocking agent include a phenol type blocking agent like phenol, cresol, xylenol, chlorophenol, and ethylphenol; a lactam type blocking agent like ε-caprolactam, δ-valerolactam, γ-butyrolactam, and β-propiolactam; an activated methylene type blocking agent like ethyl acetoacetate and acetyl acetone; an alcohol type blocking agent like methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; an oxime type blocking agent like formaldehyde oxime, acetaldoxime, acetoxime, methyl ethyl ketoxime, diacetyl monoxime, and cyclohexane oxime; a mercaptan type blocking agent like butylmercaptan, hexylmercaptan, t-butylmercaptan, thiophenol, methylthiophenol, and ethylthiophenol; an acid amide type blocking agent like acetic acid amide and benzamide; an imide type blocking agent like succinic acid imide and maleic acid imide; an amine type blocking agent like xylidine, aniline, butylamine, and dibutylamine; an imidazole type blocking agent like imidazole and 2-ethylimidazole, and; an imine type blocking agent like methyleneimine and propylene imine.

The blocked isocyanate compound may be a commercially available product and examples thereof include SUMIDUR (registered trademark) BL-3175, BL-4165, BL-1100, BL-1265, DESMODUR (registered trademark) TPLS-2957, TPLS-2062, TPLS-2078, TPLS-2117, DESMOSOME (registered trademark) 2170, DESMOSOME 2265 (all manufactured by Sumitomo Bayer Urethane Co., Ltd.), CORONATE (registered trademark) 2512, CORONATE 2513, and CORONATE 2520 (all manufactured by Nippon Polyurethane Industry Co., Ltd.), B-830, B-815, B-846, B-870, B-874, and B-882 (all manufactured by Mitsui Takeda Chemicals Inc.), and TPA-B80E, 17B-60PX and E402-B80T (all manufactured by Asahi Kasei Chemicals Corporation). SUMIDUR BL-3175 and BL-4265 are obtained by using methylethyl oxime as a blocking agent. A compound having plural isocyanate groups or blocked isocyanate groups in the molecule may be used either singly or in combination of two or more.

The addition amount of the compound having plural isocyanate groups or blocked isocyanate groups in the molecule is preferably 1 to 100 parts by weight compared to 100 parts by weight of the carboxyl group-containing resin. When the addition amount is less than 1 part by weight, sufficient toughness of a coating film is not obtained. On the other hand, when it is more than 100 parts by weight, storage stability is reduced. More preferably, the addition amount is 2 to 70 parts by weight.

When a thermocurable resin having plural cyclic (thio) ether groups in the molecule is used, a thermocuring catalyst is preferably contained. Specific examples of the thermocuring catalyst include imidazole derivatives like imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds like dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine, hydrazine compounds like adipic acid dihydrazide and sebacic acid dihydrazide, and; phosphorus compounds like triphenylphosphine. Further, specific examples of a commercially available product thereof include, as an imidazole-based compound, 2MZ-A, 2MZ-OK, 2PHZ, 2P4BHZ, 2P4 MHZ manufactured by Shikoku Chemicals Corporation, U-CAT (registered trademark) 3503N, U-CAT3502T (all are the names of block isocyanate compound of dimethylamine), DBU, DBN, U-CATSA102, and U-CAT5002 (trade names of bicyclic amidine compounds and salts thereof) manufactured by SAN-APRO LIMITED. However, it is not specifically limited thereto and a thermocuring catalyst consisting of an epoxy resin or an oxetane compound or a thermocuring catalyst which promotes a reaction between an epoxy group and/or an oxetanyl group and a carboxyl group can be used. It may be used either singly or in combination of two or more. Further, guanamine, acetoguanamine, benzoguanamine, melamine, and S-triazine derivatives like 2,4-diamino-6-methacryloyloxyethyl-S-triazine, 2-vinyl-2,4-diamino-S-triazine, 2-vinyl-4,6-diamino-S-triazine isocyanuric acid adduct, and 2,4-diamino-6-methacryloyloxyethyl-S-triazine isocyanuric acid adduct may be also used. It is preferable that the compounds also functioning as an agent for imparting adhesion are used in combination with a thermocuring catalyst.

The thermocuring catalyst used at common addition ratio is sufficient, and the addition amount thereof is preferably 0.1 to 20 parts by weight, and more preferably 0.5 to 15 parts by weight compared to 100 parts by weight of the carboxyl group-containing resin or the thermocurable component having plural cyclic (thio)ether groups in the molecule, for example.

The photocurable resin composition of the preferred embodiment of the invention may be added with a colorant. As a colorant, those having red, blue, green, or yellow color that are well known in the field can be used, and any one of a pigment, a dye, and a color may be used. However, from the viewpoint of reducing a burden to an environment and effects on human body, the colorant preferably does not contain a halogen.

As a red colorant, a monoazo-based, a disazo-based, an azolake-based, a benzimidazolone-based, a perylene-based, a diketopyrrolopyrrole-based, a condensed azo-based, an anthraquinone-based, a quinacridone-based colorant or the like can be used. Specific examples include those given with the Color Index (C. I.; published by The Society of Dyers and Colourists) number as described below.

monoazo-based: Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, 269.

disazo-based: Pigment Red 37, 38, 41.

monoazolake-based: Pigment Red 48:1, 48:2, 48:3, 48:4, 49:1, 49:2, 50:1, 52:1, 52:2, 53:1, 53:2, 57:1, 58:4, 63:1, 63:2, 64:1, 68.

benzimidazolone-based: Pigment Red 171, Pigment Red 175, Pigment Red 176, Pigment Red 185, Pigment Red 208.

perylene-based: Solvent Red 135, Solvent Red 179, Pigment Red 123, Pigment Red 149, Pigment Red 166, Pigment Red 178, Pigment Red 179, Pigment Red 190, Pigment Red 194, Pigment Red 224.

diketopyrrolopyrrole-based: Pigment Red 254, Pigment Red 255, Pigment Red 264, Pigment Red 270, Pigment Red 272.

condensed azo-based: Pigment Red 220, Pigment Red 144, Pigment Red 166, Pigment Red 214, Pigment Red 220, Pigment Red 221, Pigment Red 242.

anthraquinone-based: Pigment Red 168, Pigment Red 177, Pigment Red 216, Solvent Red 149, Solvent Red 150, Solvent Red 52, Solvent Red 207.

quinacridone-based: Pigment Red 122, Pigment Red 202, Pigment Red 206, Pigment Red 207, Pigment Red 209.

As a blue colorant, a phthalocyanine-based, an anthraquinone-based and the like are used. Examples of the pigment-based colorant include Pigment Blue 15, Pigment Blue 15:1, Pigment Blue 15:2, Pigment Blue 15:3, Pigment Blue 15:4, Pigment Blue 15:6, Pigment Blue 16, Pigment Blue 60, and examples of the dye-based colorant include Solvent Blue 35, Solvent Blue 63, Solvent Blue 68, Solvent Blue 70, Solvent Blue 83, Solvent Blue 87, Solvent Blue 94, Solvent Blue 97, Solvent Blue 122, Solvent Blue 136, Solvent Blue 67, Solvent Blue 70. In addition to them, a metal substituted or unsubstituted phthalocyanine compound can be also used.

As a green colorant, a phthalocyanine-based, an anthraquinone-based, a perylene-based and the like are also used. Examples thereof include Pigment Green 7, Pigment Green 36, Solvent Green 3, Solvent Green 5, Solvent Green 20, and Solvent Green 28. In addition to them, a metal substituted or unsubstituted phthalocyanine compound can be also used.

As a yellow colorant, a monoazo-based, a disazo-based, a condensed azo-based, a benzimidazolone-based, an isoindolinone-based, an anthraquinone-based colorant or the like can be used. Specific examples are as described below.

anthraquinone-based: Solvent Yellow 163, Pigment Yellow 24, Pigment Yellow 108, Pigment Yellow 193, Pigment Yellow 147, Pigment Yellow 199, Pigment Yellow 202.

isoindolinone-based: Pigment Yellow 110, Pigment Yellow 109, Pigment Yellow 139, Pigment Yellow 179, Pigment Yellow 185.

condensed azo-based: Pigment Yellow 93, Pigment Yellow 94, Pigment Yellow 95, Pigment Yellow 128, Pigment Yellow 155, Pigment Yellow 166, Pigment Yellow 180.

benzimidazolone-based: Pigment Yellow 120, Pigment Yellow 151, Pigment Yellow 154, Pigment Yellow 156, Pigment Yellow 175, Pigment Yellow 181.

monoazo-based: Pigment Yellow 1, 2, 3, 4, 5, 6, 9, 10, 12, 61, 62, 62:1, 65, 73, 74, 75, 97, 100, 104, 105, 111, 116, 167, 168, 169, 182, 183.

disazo-based: Pigment Yellow 12, 13, 14, 16, 17, 55, 63, 81, 83, 87, 126, 127, 152, 170, 172, 174, 176, 188, 198.

In addition to the above, a colorant having a violet color, an orange color, a brown color, or a black color or the like may be used under the purpose of controlling color tone. Specific examples thereof include Pigment Violet 19, 23, 29, 32, 36, 38, 42, Solvent Violet 13, 36, Pigment Orange 1, Pigment Orange 5, Pigment Orange 13, Pigment Orange 14, Pigment Orange 16, Pigment Orange 17, Pigment Orange 24, Pigment Orange 34, Pigment Orange 36, Pigment Orange 38, Pigment Orange 40, Pigment Orange 43, Pigment Orange 46, Pigment Orange 49, Pigment Orange 51, Pigment Orange 61, Pigment Orange 63, Pigment Orange 64, Pigment Orange 71, Pigment Orange 73, Pigment Brown 23, Pigment Brown 25, Pigment Black 1, and Pigment Black 7.

The addition ratio of the colorant is not specifically limited. However, it is preferably 10 parts by weight or less compared to 100 parts by weight of the carboxyl group-containing resin. More preferably, it is 0.1 to 5 parts by weight.

In the photocurable resin composition according to this preferred embodiment of the invention, the compound having plural ethylenically unsaturated groups in the molecule is photo-cured by irradiation of active energy ray and used to insolubilize the carboxyl group-containing resin having an ethylenically unsaturated group in an aqueous alkali solution or to help the insolubilization of the resin. Examples of the compound include diacrylates of glycol like ethylene glycol, methoxytetraethylene glycol, polyethylene glycol, and propylene glycol; polyvalent acrylates with a polyhydric alcohol like hexanediol, trimethylol propane, pentaerythritol, dipentaerythritol, and tris-hydroxyethyl cyanurate, or an ethylene oxide or propylene oxide adduct thereof; polyvalent acrylates like phenoxyacrylate, bisphenol A diacrylate and an ethylene oxide or propylene oxide adduct of the phenols; polyvalent acrylates of glycidyl ether like glycerin diglycidyl ether, glycerin triglycidyl ether, trimethylol propane triglycidyl ether, and triglycidyl isocyanurate, and; melamine acrylate, and/or methacrylates corresponding to each acrylate.

Further examples include an epoxy acrylate resin wherein a polyfunctional epoxy resin like cresol Novolac type epoxy resin is reacted with acrylic acid and an epoxy urethane acrylate compound in which the hydroxyl group of the epoxy acrylate resin is reacted with hydroxyacrylate like pentaerythritol triacrylate and a half urethane compound of diisocyanate like isophorone diisocyanate. These epoxy acrylate resins can enhance the photocurability without lowering touch dryness of fingers.

Addition amount of the compound having plural ethylenically unsaturated groups in the molecule is preferably 5 to 100 parts by weight compared to 100 parts by weight of the carboxyl group-containing resin. When the addition amount is less than 5 parts by weight, photocurability is lowered and it is difficult to form a pattern by alkali development after irradiation with active energy ray. On the other hand, when it is more than 100 parts by weight, solubility in an aqueous alkali solution is lowered, yielding a brittle coating film. The addition amount is more preferably 1 to 70 parts by weight.

To improve physical strength or the like of a coating film, the photocurable resin composition of the preferred embodiment of the invention may contain a filler, if necessary. An inorganic or organic filler that are well known in the field may be used as a filler. Barium sulfate, spherical silica, hydrotalcite, and talc are particularly preferably used. Further, to obtain white appearance or inflammability, metal oxides like titan oxide and metal hydroxides like aluminum hydroxide may be used as a body pigment filler. The addition amount of the filler is 75% by weight or less in the total weight of the composition. When the addition amount of the filler is more than 75% by weight in the total weight of the composition, viscosity of an insulating composition is high so that coatability or moldability is lowered or a brittle cured product is obtained. More preferably, the addition amount is at the ratio of 0.1 to 60% by weight.

To synthesize the carboxyl group-containing resin or to prepare a composition or to control viscosity for coating on a board or a film, the photocurable resin composition of the preferred embodiment of the invention may employ an organic solvent.

Examples of the organic solvent include ketones, aromatic hydrocarbons, glycol ethers, glycol ether acetates, esters, alcohols, aliphatic hydrocarbons, and petroleum-based solvents. Specific examples include ketones like methylethyl ketone and cyclohexanone; aromatic hydrocarbons like toluene, xylene, and tetramethylbenzene; glycol ethers like cellosolve, methyl cellosolve, butyl cellosolve, carbitol, methylcarbitol, butylcarbitol, propylene glycol monomethyl ether, dipropylene glycol monomethyl ether, dipropylene glycol diethyl ether, and triethylene glycol monoethyl ether; esters like ethyl acetate, butyl acetate, dipropylene glycol methyl ether acetate, propylene glycol methyl ether acetate, propylene glycol ethyl ether acetate, and propylene glycol butyl ether acetate; alcohols like ethanol, propanol, ethylene glycol, and propylene glycol; aliphatic hydrocarbons like octane and decane, and; petroleum-based solvents like petroleum ether, petroleum naphtha, hydrogenated petroleum naphtha, and solvent naphtha. The organic solvent may be used either singly or in combination of two or more.

Once oxidized, most polymer materials undergo oxidative deterioration in turn to cause a reduction in function of the polymer components. Thus, in order to prevent oxidation, an anti-oxidant including (1) a radical supplement to scavenge radicals generated and/or (2) a peroxide dissociating agent which dissociates peroxides generated into a non-toxic substance to prevent further generation of radicals may be added to the photocurable resin composition of the invention.

Examples of the anti-oxidant which functions as a radical supplement include a phenol-based compound like hydroquinone, 4-t-butylcatechol, 2-t-butylhydroquinone, hydroquinone monomethyl ether, 2,6-di-t-butyl-p-cresol, 2,2-methylene-bis-(4-methyl-6-t-butylphenol), 1,1,3-tris(2-methyl-4-hydroxy-5-t-butylphenyl)butane, 1,3,5-trimethyl-2,4,6-tris(3,5-di-t-butyl-4-hydroxybenzyl)benzene, and 1,3,5-tris(3', 5'-di-t-butyl-4-hydroxybenzyl)-S-triazine-2,4,6-(1H, 3H, 5H)trione, a quinone-based compound like metaquinone and benzoquinone, and an amine-based compound like bis(2,2,6, 6-tetramethyl-4-piperidyl)-sebacate and phenothiazine.

The radical supplement may be a commercially available product and examples thereof include ADK STAB (registered trademark) AO-30, ADK STAB AO-330, ADK STAB AO-20, ADK STAB LA-77, ADK STAB B LA-57, ADK STAB LA-67, ADK STAB LA-68, ADK STAB LA-87 (all manufactured by ADEKA CORPORATION), and IRGANOX (registered trademark) 1010, IRGANOX 1035, IRGANOX 1076, IRGANOX 1135, TINUVIN (registered trademark) 111 FDL, TINUVIN 123, TINUVIN 144, TINUVIN 152, TINUVIN 292, TINUVIN 5100 (all manufactured by Ciba Japan K.K.).

Specific examples of the anti-oxidant functioning as a peroxide dissociating agent include a phosphorus-based compound like triphenyl phosphate, and a sulfur-based compound like pentaerythritol tetralauryl thiopropionate, dilauryl thiodipropionate, and distearyl 3,3'-thiodipropionate.

The peroxide dissociating agent may be a commercially available product and examples thereof include ADK STAB TPP (manufactured by ADEKA CORPORATION), MARK AO-412S (manufactured by Adeka Argus Chemical Co., Ltd.), and SUMILIZER (registered trademark) TPS (manufactured by Sumitomo Chemical Co. Ltd.).

The anti-oxidant may be used either singly or in combination of two or more.

Since the polymer materials absorb light and undergo degradation • deterioration, an UV absorbent may be used for the photocurable resin composition of the invention as a measure for stabilization against UV light in addition to an anti-oxidant.

Examples of the UV absorbent include benzophenone derivatives, benzoate derivatives, benzotriazole derivatives, triazine derivatives, benzothiazole derivatives, cinnamate derivatives, anthranylate derivatives, and dibenzoylmethane derivatives.

Specific examples of the benzophenone derivatives include 2-hydroxy-4-methoxy-benzophenone 2-hydroxy-4-methoxybenzophenone, 2-hydroxy-4-n-octoxybenzophenone, 2,2'-dihydroxy-4-methoxybenzophenone and 2,4-dihydroxybenzophenone.

Specific examples of the benzoate derivatives include 2-ethylhexylsalicylate, phenylsalicylate, p-tert-butylphenylsalicylate, 2,4-di-tert-butylphenyl-3,5-di-tert-butyl-4-hydroxybenzoate and hexadecyl-3,5-di-tert-butyl-4-hydroxybenzoate.

Specific examples of the benzotriazole derivatives include 2-(2'-hydroxy-5'-t-butylphenyl)benzotriazole, 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-butylphenyl)-5-chlorobenzo triazole, 2-(2'-hydroxy-5'-methylphenyl)benzotriazole and 2-(2'-hydroxy-3',5'-di-tert-amylphenyl)benzotriazole.

Specific examples of the triazine derivatives include hydroxyphenyltriazine and bisethylhexyloxyphenol methoxyphenyltriazine.

The UV absorbent may be a commercially available product and examples thereof include TINUVIN PS, TINUVIN 99-2, TINUVIN 109, TINUVIN 384-2, TINUVIN 900, TINUVIN 928, TINUVIN 1130, TINUVIN 400, TINUVIN 405, TINUVIN 460, TINUVIN 479 (all manufactured by Ciba Japan K.K.). The UV absorbent may be used either singly or in combination of two or more. When used in combination of an anti-oxidant, a cured product obtained from the photocurable resin composition of the preferred embodiment of the invention can be stabilized.

The photocurable resin composition of the preferred embodiment of the invention may contain, if necessary, additives that are well known in the field like a thermal polymerization inhibitor, a thickening agent like fine silica powder, organic bentonite, and montmorilonite, a defoaming agent and/or a leveling agent such as silicone-based, fluorine-based, or polymer-based agent, a silane coupling agent such as imidazole-based, thiazole-based, or triazole-based coupling agent, an anti-oxidant, and an anti-rust agent.

Among them, the thermal polymerization inhibitor may be used to prevent thermal polymerization or polymerization over time of a polymerizable compound contained in the photocurable resin composition of a preferred embodiment of the invention. Specific examples the thermal polymerization inhibitor include 4-methoxyphenol, hydroquinone, alkyl or aryl-substituted hydroquinone, t-butylcatechol, pyrogallol, 2-hydroxybenzophenone, 4-methoxy-2-hydroxybenzophenone, copper (I) chloride, phenothiazine, chloranyl, naphthylamine, β-naphthol, 2,6-di-t-butyl-4-cresol, 2,2'-methylenebis(4-methyl-6-t-butylphenol), pyridine, nitrobenzene, dinitrobenzene, picric acid, 4-toluidine, methylene blue, a reaction product between copper and an organic chelating agent, methyl salicylate, and phenothiazine, a nitroso compound, and a chelate between a nitroso compound and Al.

For the photocurable resin composition of the preferred embodiment of the invention, an adhesion promoter can be used to improve adhesion between layers or adhesion between a photosensitive resin layer and a substrate, and specific examples thereof include benzimidazole, benzoxazole, benzothiazole, 3-morpholinomethyl-1-phenyl-triazole-2-thione, 5-amino-3-morpholinomethyl-thiazole-2-thione, triazole, tetrazole, benzotriazole, carboxybenzotriazole, benzotriazole containing an amino group, and a silane coupling agent.

The photocurable resin composition of the preferred embodiment of the invention is produced with a pre-determined addition ratio. For example, after being adjusted with an organic solvent to have viscosity suitable for coating method, the composition is coated on a substrate according to a method including dip coating, flow coating, roll coating, bar coating, screen printing, and curtain coating.

According to volatilization and drying (pseudo-drying) of an organic solvent contained the composition at the temperature of about 60 to 100° C., a tack-free coating film (i.e., an insulating resin layer) is formed. The volatilization drying can be performed by using a hot air circulation drying furnace, an IR furnace, a hot plate, a convention oven (i.e., a method for countercurrent contact with hot air in a dryer using an apparatus equipped with a heat source for steam-based air heating system and a method of spraying hot air from a nozzle to a support).

It is also possible that a dried film is formed with the photocurable resin composition and then adhered on a substrate to form an insulating resin layer.

The dried film has a structure in which a carrier film like polyethylene terephthalate, an insulating resin layer like a solder resist layer, and if necessary, a releasable cover film, are laminated in this order, for example.

The insulating resin layer is a layer obtained by coating drying the photocurable resin composition on a carrier film or a cover film. The insulating resin layer is formed by evenly coating the photocurable resin composition of the preferred embodiment of the invention on a carrier film to thickness of 10 to 150 μm using a blade coater, a lip coater, a comma coater, a film coater or the like followed by drying. If necessary, a dried film can be formed by laminating a cover film. In this case, it is also possible that the photocurable resin composition is coated on a cover film and dried and then laminated with a carrier film.

As a carrier film, for example, a thermoplastic film like polyester film with thickness of 2 to 150 μm is used.

As a cover film, a polyethylene film and a polypropylene film or the like can be used. A film having smaller adhesiveness to a solder resist layer than a carrier film is preferable.

By using the dried film above, stripping a cover film when it is used, overlaying an insulating resin layer with a substrate and fixing them by using a laminator, etc., an insulating resin layer is formed on a substrate. In addition, the carrier film can be released either before or after the exposure.

As a substrate on which a coating film is formed or a dried filed is adhered, a copper clad laminate of all grades (FR-4 and the like) wherein materials for a copper clad laminate for high frequency circuit are used by having a composite like paper-phenol resin, paper-epoxy resin, glass fabric-epoxy resin, glass-polyimide, glass fabric/non-woven fabric-epoxy resin, glass fabric/paper-epoxy resin, synthetic fiber-epoxy resin, and fluoro resin • polyethylene • PPO • cyanate ester, a polyimide film, a PET film, a glass substrate, a ceramic substrate, and a wafer plate can be used.

Further, selective exposure is carried out with active energy ray through a photomask in which a pattern is formed in a contact (or non-contact) manner, or direct pattern exposure is carried out by using a laser direct exposure device.

As an exposure device used for irradiation of active energy ray, a direct patterning device (for example, a laser direct imaging device for directly drawing an image with laser by following CAD data supplied from a computer), an exposure device having a metal halide lamp, an exposure device having a (ultra)high mercury lamp, an exposure device having a mercury short arc lamp, or a direct patterning device using UV lamp like a (ultra) high mercury lamp can be used.

Laser beam with wavelength in the range of 350 to 410 nm is preferred as the active energy ray. Laser beam with wavelength in the range of 350 to 410 nm is preferred as the active energy ray. With the maximum wavelength within the range, radicals can be effectively produced by a photopolymerization initiator. It may be gas laser or solid laser, as long as it uses laser beam with the wavelength in the range. Although it may vary depending on film thickness or the like, the exposure amount is generally within the range of 5 to 200 mJ/cm$^2$, more preferably 5 to 100 mJ/cm$^2$, and still more preferably 5 to 50 mJ/cm$^2$.

As the direct patterning device, those manufactured by PENTAX, Orbotech Japan Co., Ltd. or the like may be used, for example. Any device capable of emitting laser beam with wavelength of 350 to 410 nm can be used.

Thereafter, by curing an exposed section (i.e., a section irradiated with active energy ray) by exposure and developing an unexposed section using a dilute aqueous solution of alkali (for example, an aqueous solution of 0.3 to 3% by weight $Na_2CO_3$) a cured product (i.e., pattern) is formed.

Examples of a development method that can be used include a dipping method, a shower method, a spray method, and a brush method. Examples of a development liquid that can be used include an aqueous solution of alkali like potassium hydroxide, sodium hydroxide, sodium carbonate, potassium carbonate, sodium phosphate, sodium silicate, ammonia, and amines.

Further, when a thermal curing component is added, it is preferable to perform thermal curing by heating at the temperature of about 140 to 180° C., for example. According to thermal curing, the carboxyl group in the carboxyl group-containing resin and a thermocurable component having plural cyclic (thio)ether groups in the molecule, for example, are reacted with each other, and as a result a cured product (pattern) having excellent characteristics like heat resistance, chemical resistance, moisture resistance, adhesiveness, and electrical characteristics, or the like can be obtained.

EXAMPLES

Herein below, the embodiments of the invention are explained specifically in view of the examples and comparative examples. However, it is evident that the invention is not limited by the examples. Further, the terms "part" and "%" as used herein under are all based on weight, unless specifically described otherwise.

Synthetic examples of the carboxyl group-containing resin (A-1):

To 600 g of diethylene glycol monoethyl ether acetate, 1070 g of ortho-cresol Novolac type epoxy resin [EPICLON (registered trademark) N-695, manufactured by DIC Corporation, softening point of 95° C., epoxy eq. of 214, and average number of functional groups of 7.6] (number of glycidyl group (total number of aromatic rings): 5.0 mol), 360 g (5.0 mol) of acrylic acid, and 1.5 g of hydroquinone were added and heated at 100° C. under stirring to dissolve them homogeneously.

Subsequently, 4.3 g of triphenylphosphine was added to the solution and reacted for 2 hours by heating at 110° C. After increasing the temperature to 120° C., the reaction was further carried out for 12 hours. To the resulting reaction solution, 415 g of an aromatic-based hydrocarbon (SOLVESSO 150) and 456.0 g (3.0 mol) of tetrahydrophthalic anhydride were added. The reaction was performed for four hours at 110° C. After cooling, a resin solution having solid content of 65% and solid matter acid value of 89 mgKOH/g was obtained. It was designated as the resin solution A-1.

Synthetic Examples of the Carboxyl Group-Containing Resin (A-2)

To an autoclave equipped with a thermometer, a device for introducing nitrogen gas and alkylene oxide, and a stirrer, 119.4 g of Novolac type cresol resin (trade name: Shonol CRG 951, manufactured by SHOWA HIGHPOLYMER CO., LTD., OH eq.: 119.4), 1.19 g of potassium hydroxide, and 119.4 g of toluene were added and the temperature was increased by heating under stirring while purging the system with nitrogen gas. Next, 63.8 g of propylene oxide were slowly added dropwise thereto and reacted for 16 hours at 125 to 132° C., 0 to 4.8 kg/cm².

After cooling to room temperature, 1.56 g of 89% phosphoric acid was added to the reaction solution to neutralize potassium hydroxide. As a result, a solution of reaction product between propylene oxide and Novolac type cresol resin with 62.1% non-volatile components and hydroxy value of 182.2 g/eq was obtained, wherein average 1.08 mol of alkylene oxide is added per 1 eq. of a phenolic hydroxyl group.

293.0 g of alkylene oxide reaction solution of Novolac type cresol resin obtained, 43.2 g of acrylic acid, 11.53 g of methanesulfonic acid, 0.18 g of methyl hydroquinone, and 252.9 g of toluene were added to a reactor equipped with a stirrer, a thermometer, and an air injection tube. The reaction was allowed to progress for 12 hours at 110° C. under stirring while adding an air at the rate of 10 mL/min. The water generated according to the reaction is an azeotropic mixture with toluene, and 12.6 g of water was eluted.

After cooling to room temperature, the reaction solution obtained was neutralized with 35.35 g of 15% aqueous solution of sodium hydroxide followed by washing with water. After that, toluene was distilled off by replacement with 118.1 g of diethylene glycol monoethyl ether acetate in an evaporator. As a result, a solution of Novolac type acrylate resin was obtained.

After that, 332.5 g of the solution of Novolac type acrylate resin and 1.22 g of triphenylphosphine were added to a reactor equipped with a stirrer, a thermometer, and an air injection tube. 60.8 g of tetrahydrophthalic anhydride was slowly added thereto while adding an air at the rate of 10 mL/min and stirring. The reaction was allowed to progress for 6 hours at 95 to 101° C. As a result, a carboxyl group-containing photosensitive resin having non-volatile content of 71%, and solid matter acid value of 88 mgKOH/g was obtained. It was designated as varnish A-2.

Examples 1 to 13 and Comparative Examples 1 to 3

The resin solution of each synthetic example was mixed with various components and ratio (based on parts by weight) described in the Table 1. After pre-mixing in a stirrer, it was kneaded with a three roll mill to produce the photosensitive resin composition for solder resist. Dispersion degree of the photosensitive resin composition obtained above was evaluated by particle size measurement using Grind Meter manufactured by ERICHSEN GMBH & CO. KG. As a result, each was found to be 15 μm or less.

TABLE 1

| Composition (parts by weight) | Example | | | | | | | | | | | | | Comparative Example | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 1 | 2 | 3 |
| A-1 (Solid) | | | 100 | | | | | | | | | | | 100 | 100 | 100 |
| A-2 (Solid) | 100 | 100 | | | | 100 | 100 | 100 | 100 | 100 | 100 | 100 | 100 | | | |
| A-3* (Solid) | | | | 100 | | | | | | | | | | | | |
| A-4* (Solid) | | | | | 100 | | | | | | | | | | | |
| IRGACURE 907*³ | | 5 | 5 | 5 | 5 | 5 | | 5 | 5 | 5 | 5 | 5 | 5 | 5 | 5 | 5 |
| IRGACURE OXE 02*⁴ | 2 | 1 | 1 | 1 | 1 | 1 | 2 | 1 | 1 | 1 | 1 | 1 | 1 | 1 | 1 | 1 |
| PB 3600*⁵ | 38 | 38 | 38 | 38 | 38 | | | | 38 | 38 | 38 | 38 | 38 | | | |
| Poly-bd*⁶ | | | | | | 20 | 15 | 25 | | | | | | | | |
| BPV-1X*⁷ | | | | | | | | | 5 | | | | | | | |
| OPE-2St*⁸ | 5 | 5 | 5 | 5 | 5 | 5 | 5 | 5 | 5 | | 5 | 5 | 5 | | 5 | 5 |
| ACCEL M*⁹ | | 0.2 | 0.2 | 0.2 | 0.2 | 0.2 | 0.2 | 0.2 | 0.2 | | | | 0.2 | | | 0.2 |
| KARENZ MTBD1*¹⁰ | | | | | | | | | | | 0.5 | | | | | |
| ZISNET F*¹¹ | | | | | | | | | | | | 0.1 | | | | |
| YSLV-80XY*¹² | | | | | | | 30 | | | | | | | 20 | 20 | 20 |
| YX-4000*¹³ | | | | | | 30 | | | | | | | | 10 | 10 | 10 |
| TPA-B80E*¹⁴ | | | | | | | 10 | | 5 | 5 | | | | | | |

TABLE 1-continued

| Composition (parts by weight) | Example 1 | 2 | 3 | 4 | 5 | 6 | 7 | 8 | 9 | 10 | 11 | 12 | 13 | Comparative Example 1 | 2 | 3 |
|---|---|---|---|---|---|---|---|---|---|---|---|---|---|---|---|---|
| Mw-100LM*[15] | | | | | | | | | 20 | 10 | 10 | | | | | |
| Benzoguanamine | 2 | 1 | 1 | 1 | 1 | 1 | 3 | | 1 | 2 | 1 | 1 | 1 | 1 | 1 | 1 |
| Melamine | 3 | 2 | 2 | 2 | 2 | 2 | | 3 | 2 | | 2 | 2 | 2 | 2 | 2 | 2 |
| Phenothiazine | | | | | | | 0.2 | 0.2 | 0.2 | 0.2 | | | | | | |
| IRGANOX 1010*[16] | 2 | | | | | | 2 | 2 | | | | | | | | |
| DPHA*[17] | 15 | 15 | 15 | 15 | 15 | 15 | 15 | 15 | 20 | 20 | 15 | 15 | 15 | 15 | 15 | 15 |
| Barium sulfate*[18] | 100 | 100 | 100 | 100 | 100 | 100 | 100 | 100 | 100 | 100 | 100 | 100 | 100 | 100 | 100 | 100 |
| Hydrotalcite | | | | | | | | | | | | | 10 | | | |
| G-1*[19] | 0.3 | 0.3 | 0.3 | 0.3 | 0.3 | 0.3 | 0.3 | 0.3 | 0.3 | 0.3 | 0.3 | 0.3 | 0.3 | 0.3 | 0.3 | 0.3 |
| G-2*[20] | 0.8 | 0.8 | 0.8 | 0.8 | 0.8 | 0.8 | 0.8 | 0.8 | 0.8 | 0.8 | 0.8 | 0.8 | 0.8 | 0.8 | 0.8 | 0.8 |
| Silicone-based defoaming agent | 3 | 3 | 3 | 3 | 3 | 3 | 3 | 3 | 3 | 3 | 3 | 3 | 3 | 3 | 3 | 3 |
| DPM*[21] | 3 | 3 | 3 | 3 | 3 | 3 | 3 | 3 | 3 | 3 | 3 | 3 | 3 | 3 | 3 | 3 |

Remarks
*[1]: ZFR-1124 (manufactured by Nippon Kayaku Co., Ltd.)
*[2]: ZCR-1601 H (manufactured by Nippon Kayaku Co., Ltd.)
*[3]2-methyl-1-(4-methylthiophenyl)-2-morpholinopropan-1-one (manufactured by Ciba Japan K.K.)
*[4]ethanone, 1-[9-ethyl-6-(2-methylbenzoyl)-9H-carbazol-3-yl]1,1-(O-acetyloxime) (manufactured by Ciba Japan K.K.)
*[5]epoxylated polybutadiene (manufactured DAICEL CHEMICAL INDUSTRIES, LTD.)
*[6]polybutadiene having terminal hydroxyl group (manufactured by Idemitsu Kosan Co., Ltd.)
*[7]Ripoxy BPV-1X (manufactured by SHOWA HIGHPOLYMER CO., LTD.)
*[8]oligo phenylene ether compound having terminal styrene (manufactured by Mitsubishi Gas Chemical Company, Inc.)
*[9]2-mercaptobenzothiazole (manufactured by Kawaguchi Chemical Industry Co., Ltd.)
*[10]1,4-bis(3-mercaptobutyryloxy)butane (manufactured by Showa Denko K.K.)
*[11]2,4,6-trimercapto-s-triazine (manufactured by Sankyo Kasei Co., Ltd.)
*[12]phenol Novolac type epoxy resin (manufactured by The Dow Chemical Company)
*[13]bixylenol type epoxy resin (manufactured by Mitsubishi Chemical Corporation)
*[14]blocked isocyanate (manufactured by Asahi Kasei Chemicals Corporation)
*[15]methylated melamine resin (manufactured by Sanwa Chemical Co., Ltd.)
*[16]anti-oxidant (manufactured by Ciba Japan K.K.)
*[17]dipentaerythritol hexaacrylate (manufactured by Nippon Kayaku Co., Ltd.)
*[18]B-30 (manufactured by Sakai Chemical Industry Co., Ltd.)
*[19]C.I. Pigment Blue 15:3
*[20]C.I. Pigment Yellow 147
*[21]dipropylene glycol monomethyl ether Performance Evaluation:

<Optimum Exposure Amount>

A circuit pattern board with copper thickness of 35 μm was subjected to buff roll polishing, washed with water, and dried. The photocurable • thermocurable resin composition of the Example and the Comparative Example was coated on the entire surface of the board by screen printing, and then the board was dried for 60 min in a hot air circulation drying furnace at 80° C. After drying, the board was subjected to light exposure by an exposure device having a high pressure mercury lamp (a short arc lamp) through a step tablet (Kodak No 2). Further, the board was developed for 60 sec (30° C., 0.2 MPa, and 1% by weight aqueous solution of $Na_2CO_3$). When the pattern of the remaining step tablet is step 7, it is taken as optimum exposure amount.

<Developability>

The photocurable resin composition of the Examples and the Comparative Examples was coated on a copper beta board by screen printing so that the thickness after drying is about 25 and dried for 30 min in a hot air circulation furnace at 80° C. After drying, development was carried out by using an aqueous solution of 1% by weight sodium carbonate and the time until the dried coated film is removed was measured with a stopwatch.

Characteristics Evaluation:

The composition of the Examples and Comparative Examples was coated on the entire surface of a pattern-formed copper foil board by screen printing to have film thickness of 20 μm after drying, dried for 30 min at 80° C., and air-cooled to room temperature. By using an exposure device having a high pressure mercury lamp (short arc lamp), a solder resist pattern was exposed on the board with the optimum exposure amount. The board was developed for 60 sec under the following condition to obtain a resist pattern; temperature: 30° C., spray pressure: 2 kg/cm², development liquid: 1% by weight aqueous solution of $Na_2CO_3$. In addition, the board was irradiated with UV light in an UV conveyer furnace with accumulated exposure amount of 1000 mJ/cm² followed by heating for 60 min at 150° C. for curing. Characteristics of the printed board obtained (board for evaluation) were evaluated as follows.

<Resistance of Non-Electrolysis Gold Plating>

By using a commercially available non-electrolysis nickel plating bath and non-electrolysis gold plating bath, plating was carried out with a condition including 0.5 μm nickel and 0.03 μm gold. After evaluating any penetration of the plating and peeling of the resist layer according to tape peeling, the presence or absence of the peeling of the resist layer was evaluated. Evaluation criteria are as follows.

⊚: No penetration or peeling was observed.

○: Slight penetration was identified after plating, but there was no peeling after tape peeling.

Δ: Very minor penetration was observed after plating, and there was peeling after tape peeling.

X: There was peeling after plating.

<Electrical Insulating Properties after Humidifying Test (HAST)>

A solder resist is coated on a board on which a comb-shaped electrode (line/space=50 μm/50 μm) was formed. After exposure • development, it was thermally cured to produce a board for evaluation. The board for evaluation was placed in a high temperature and high humidity incubator with temperature of 130° C. and humidity of 85%. By applying voltage of 5 V, HAST (Highly Accelerated Stress Test) was carried out for 192 hours. Subsequently, the electrical insulating properties after the HAST were measured.

<TCT Resistance>

A solder resist was coated on a board in which 2 mm copper line pattern is formed. After exposure development, a board for evaluation in which a resist pattern with 3 mm angle is formed on the copper line was produced by thermal curing. The board for evaluation was placed in a cold-hot cycler which has a working temperature cycle between −65° C. and 150° C. to carry out TCT (Thermal Cycle Test). Appearance of the board was observed after 600 cycles, 800 cycles, and 1000 cycles.

⊚: No problem after 1000 cycles.

○: No problem after 800 cycles, but cracks occurred after 1000 cycles.

Δ: No problem after 600 cycles, but cracks occurred after 800 cycles.

X: Cracks occurred after 600 cycles.

<PCT Resistance>

A board for evaluation on which a solder resist cured coating film is formed was subjected to PCT (Pressure Cooker Test) under the condition including 121° C., saturated, and 0.2 MPa for 168 hours or 192 hours by using a PCT device (trade name: HAST SYSTEM TPC-412 MD, manufactured by ESPEC Corp.). State of the coating film after the PCT was evaluated. The evaluation criteria are as follows.

⊚: Expanded for 192 hours, no peeling, discoloration, or dissolution.

○: Expanded for 168 hours, no peeling, discoloration, or dissolution.

Δ: Slight expansion, peeling, discoloration, and dissolution were observed.

X: Significant expansion, peeling, discoloration, and dissolution were observed.

Evaluation of Dried Film:

By using the resin composition of the Example 2 and Comparative Example 1, a board for evaluation was prepared according to the method described below and subjected to the test.

<Production of Dried Film>

The photocurable resin composition of the Example 2 and Comparative Example 1 was suitably diluted with methyl ethyl ketone, coated on a PET film (trade name: FB-50, manufactured by Toray Industries, Inc.: 16 μm) and dried at 80° C. for 30 min to form a resin composition layer with thickness of 20 μm after drying. As a result, a dried film was obtained.

<Production of Board>

The circuit-formed board was subjected to buff polishing, and the dried film was to heat-laminated thereon using a vacuum laminator (MVLP (registered trademark)-500 manufactured by MEIKI CO., LTD.) with a condition including pressure level of 0.8 MPa, 70° C., 1 min, an vacuum level of 133.3 Pa to give a board having an unexposed solder resist layer (unexposed board).

The evaluation results are given in the Table 2.

TABLE 2

| Characteristics | Example | | | | | | | | | | | | | Comparative Example | | |
| --- | --- | --- | --- | --- | --- | --- | --- | --- | --- | --- | --- | --- | --- | --- | --- | --- |
| | 1 | 2 | 3 | 4 | 5 | 6 | 7 | 8 | 9 | 10 | 11 | 12 | 13 | 1 | 2 | 3 |
| Solder resist type [D: Dried film L: Liquid state] | L | L | D | L | L | L | L | L | L | L | L | L | L | L | D | L | L |
| Optimum exposure amount (mJ/cm$^2$) | 80 | 90 | 80 | 90 | 90 | 80 | 100 | 90 | 100 | 100 | 100 | 90 | 90 | 90 | 110 | 100 | 100 | 100 |
| Developability (sec) | 20 | 20 | 20 | 15 | 25 | 18 | 22 | 23 | 23 | 25 | 23 | 25 | 30 | 20 | 20 | 20 | 20 | 20 |
| Resistance of non-electrolysis gold plating | ⊚ | ⊚ | ⊚ | ⊚ | ⊚ | ⊚ | ⊚ | ⊚ | ○ | ⊚ | ⊚ | ⊚ | ⊚ | ⊚ | ⊚ | ⊚ | ⊚ | ⊚ |
| Hast (×10$^8$ Ω) | 1 | 1 | 2 | 0.3 | 0.5 | 0.2 | 7 | 3 | 0.6 | 4 | 1 | 2 | 1 | 7 | 0.08 | 0.1 | 0.1 | 0.3 |
| TCT resistance | ⊚ | ⊚ | ⊚ | ○ | ⊚ | ○ | ○ | ⊚ | ⊚ | ⊚ | ⊚ | ⊚ | ⊚ | ⊚ | X | Δ | Δ | Δ |
| PCT resistance | ⊚ | ⊚ | ⊚ | ○ | ⊚ | ○ | ○ | ⊚ | ⊚ | ⊚ | ⊚ | ⊚ | ⊚ | ⊚ | X | Δ | Δ | ○ |

As shown in the Table 2, it is found that the Examples 1 to 13 in which a vinyl group-containing elastomer is used have sensitivity and alkali development properties equal to or greater than the Comparative Examples 1 to 3, and also have good HAST, TCT resistance, and PCT resistance. In particular, it is found that the Examples in which A-2 is used as a carboxyl group-containing resin (i.e., Examples 1, 2, and 6 to 13) have excellent electrical insulating reliability and are useful as a solder resist.

On the other hand, the Comparative Example in which a vinyl group-containing elastomer is not used shows poor TCT resistance and poor PCT resistance, and also the cured product obtained shows brittleness. Further, the Comparative Example 1 in which a compound having a styryl group is not used shows not only poor TCT resistance and poor PCT resistance but also low sensitivity, and therefore a deterioration in electrical properties was shown.

What is claimed is:

1. A photocurable resin composition comprising:
   a carboxyl group-containing resin having a carboxyl group;
   a photopolymerization initiator;
   a vinyl group-containing elastomer having a vinyl group; and
   a styryl group-containing compound having a styryl group.

2. The photocurable resin composition of claim 1, further comprising a mercapto compound.

3. A dried film obtained by a method comprising:
   coating the photocurable resin composition of claim 1 on a film; and
   drying the photocurable resin composition coated on the film.

4. A cured product obtained by a method comprising:
   photocuring with irradiation a dried coating film or a coating film, wherein the dried coating film is obtained by coating the photocurable resin composition of claim 1 on a substrate and drying the photocurable resin composition coated on the substrate, and the coating film is obtained by laminating on a substrate a dried film obtained by coating the photocurable resin composition of claim 1 on a film and drying the photocurable resin composition coated on the film.

5. A printed wiring board having a pattern of a cured product obtained by a method comprising:
photocuring with irradiation a dried coating film or a coating film,
wherein the dried coating film is obtained by coating the photocurable resin composition of claim 1 on a substrate and drying the photocurable resin composition coated on the substrate, and the coating film is obtained by laminating on a substrate a dried film obtained by coating the photocurable resin composition of claim 1 on a film and drying the photocurable resin composition coated on the film.

6. The photocurable resin composition of claim 1, wherein the carboxyl group-containing resin further comprises a photosensitive group.

7. The photocurable resin composition of claim 1, further comprising a thermocurable component.

8. The photocurable resin composition of claim 1, further comprising a colorant.

9. The photocurable resin composition of claim 1, wherein the carboxyl group-containing resin has an acid value of 40 to 200 mgKOH/g.

10. The photocurable resin composition of claim 1, wherein the carboxyl group-containing resin has an acid value of 45 to 120 mgKOH/g.

11. The photocurable resin composition of claim 1, wherein the carboxyl group-containing resin has a weight-average molecular weight of 2000 to 150,000.

12. The photocurable resin composition of claim 1, wherein the carboxyl group-containing resin has a weight-average molecular weight of 5000 to 100,000.

13. The photocurable resin composition of claim 1, comprising 20 to 60% by weight of the carboxyl group-containing resin, based on the total weight of the photocurable resin composition.

14. The photocurable resin composition of claim 1, comprising 30 to 50% by weight of the carboxyl group-containing resin, based on the total weight of the photocurable resin composition.

15. The photocurable resin composition of claim 1, comprising 3 to 100 parts by weight of the vinyl group-containing elastomer, based on 100 parts by weight of the carboxyl group-containing resin.

16. The photocurable resin composition of claim 1, comprising 10 to 60 parts by weight of the vinyl group-containing elastomer, based on 100 parts by weight of the carboxyl group-containing resin.

17. The photocurable resin composition of claim 1, comprising 1 to 50 parts by weight of the styryl group-containing compound, based on 100 parts by weight of the carboxyl group-containing resin.

18. The photocurable resin composition of claim 1, comprising 1 to 10 parts by weight of the styryl group-containing compound, based on 100 parts by weight of the carboxyl group-containing resin.

19. The cured product of claim 4, wherein the photocuring with irradiation comprises exposing the dried coating film or the coating film to a laser beam having a wavelength of 350 to 410 nm.

20. The cured product of claim 19, wherein an exposure amount is 5 to 50 mJ/cm$^2$.

* * * * *